United States Patent [19]

Jun

[11] Patent Number: 5,960,313
[45] Date of Patent: *Sep. 28, 1999

[54] METAL WIRE OF SEMICONDUCTOR DEVICE AND METHOD FOR FORMING THE SAME

[75] Inventor: Young Kwon Jun, Seoul, Rep. of Korea

[73] Assignee: LG Semicon Co., Ltd., Chungcheongbuk-Do, Rep. of Korea

[ * ] Notice: This patent is subject to a terminal disclaimer.

[21] Appl. No.: 08/852,293

[22] Filed: May 7, 1997

[30] Foreign Application Priority Data

May 16, 1996 [KR] Rep. of Korea .................... 96-016460

[51] Int. Cl.$^6$ ............................................. H01L 21/4763
[52] U.S. Cl. ........................... 438/624; 438/634; 438/637
[58] Field of Search .................................... 438/624, 634, 438/637, 638, 668, 740

[56] References Cited

U.S. PATENT DOCUMENTS

| | | | |
|---|---|---|---|
| 4,466,180 | 8/1984 | Scolof | 29/580 |
| 5,397,731 | 3/1995 | Takemura | 437/67 |
| 5,635,423 | 6/1997 | Huang et al. | 437/195 |
| 5,792,704 | 8/1998 | Jun et al. | 438/624 |

OTHER PUBLICATIONS

Dual Damascene: A ULSI Wiring Technology, Carter W. Kaanta, et al, IBM General Technology Division Essex Junction, Vernmont 05452, Jun. 11–12, 1991 VMIC COnference TH–0359–0/91/0000–0144, pp. 144–152.

International Electron Devices 1992, San Francisco, Ca. Dec. 13–16, 1992, Sponsored by Electron Devices Society of IEEE, pp. 2–6.

*Primary Examiner*—John F. Niebling
*Assistant Examiner*—Michael S. Lebentritt

[57] ABSTRACT

A metal wire and a method for forming a metal wire of a semiconductor device, including the steps of forming an insulating layer and first etch-stop layer on a substrate forming a first trench having sidewalls and a bottom by selectively removing portions of said first etch-stop layer forming a second etch-stop layer on the insulating layer, including the first trench, and first-etch stop layer etching back said second etch-stop layer from within the trench to form a mask from said first and second etch-layers exposing a portion of the trench bottom, wherein the width of the mask has a width of less than the width of the trench bottom etching the insulating layer using said first and second etch-stop layers mask to form a second trench extending through the insulating layer for holding a contact plug removing said first and second etch-stop layers and forming a contact plug and conductive layer in said first and second trenches.

20 Claims, 5 Drawing Sheets

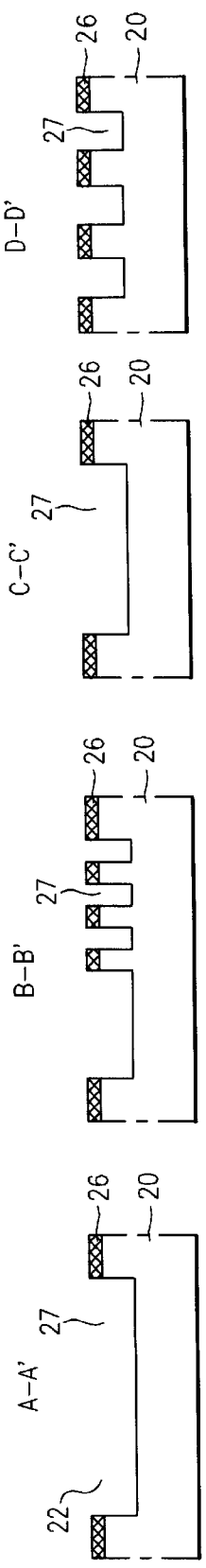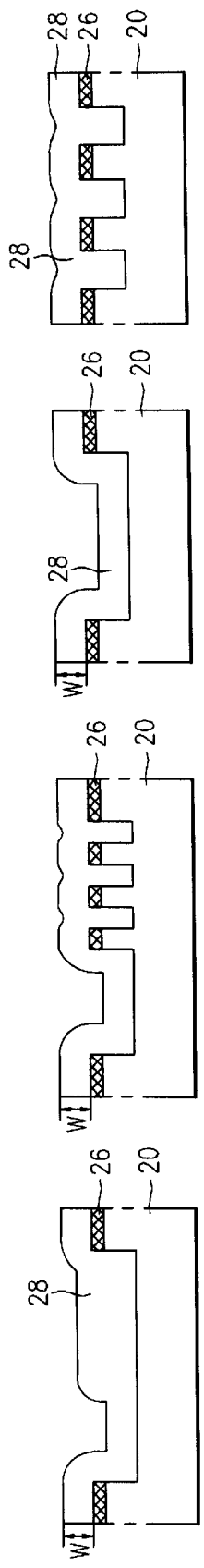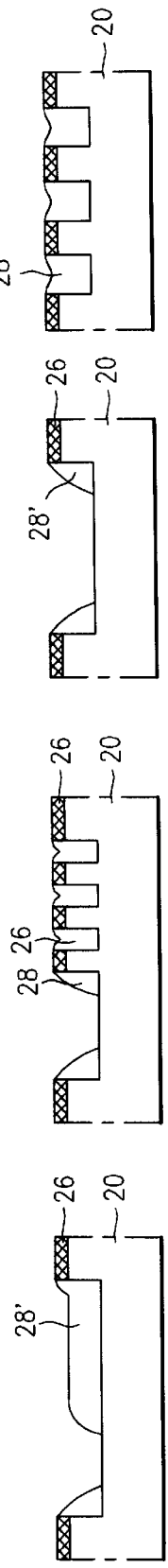
FIG.4A
FIG.4B
FIG.4C

METAL WIRE OF SEMICONDUCTOR DEVICE AND METHOD FOR FORMING THE SAME

BACKGROUND OF THE INVENTION

The present invention relates to a metal wire for a semiconductor integrated circuit, and more particularly to a metal wire of a semiconductor device and a method for forming the same that improves the resistance characteristics of the wire and its reliability by self-aligning a conductive line and a contact hole.

Generally, aluminum (and its alloy) thin films are widely used as a metalization material in semiconductor devices because of their high conductivity, facility in forming a pattern by dry-etching, and good adhesion to silicon oxide layers. Additionally, aluminum is a relatively low cost material.

As the desire for integration of the semiconductor device increases, the size of the circuit decreases and its metal wire is miniaturized and multi-layered, so that the importance of step coverage increases in the portion of the device having a topology and a contact hole such as a via hole.

If sputtering is used to apply the metalization material, the metal wire layer on an undulated area becomes partially thinned by a shadow effect, and especially on the contact hole area where an aspect ratio is greater than 1.

Therefore, instead of using a physical vapor deposition ("PVD") method, a lower pressure chemical vapor deposition ("LPCVD") method is used to apply the metalization layer which is capable of depositing the metal wire layer in a uniform thickness. Studies have been conducted for improving step coverage by forming a tungsten layer using a LPCVD method. However, since the resistivity of the tungsten metal wire layer is at least two times greater than an aluminum metalization layer, tungsten is not a practical material for forming a metalization layer.

At the same time, improved methods for forming plug layers in a contact hole have been developed.

In one method, the plug layer is formed by selectively growing a tungsten layer through a substrate exposed on the contact hole by selective CVD.

Another method for forming the plug layer includes using a barrier metal layer or glue layer on which a tungsten layer is formed over the surface of the barrier metal layer, and or glue layer. Thereafter, the layer is etched back.

However, with the selective CVD method and the etch-back method, after depositing the tungsten on the overall surface, it is required to form a reliable barrier or adhesion layer in the contact hole having a high aspect ratio.

For this purpose, it is important to obtain the minimum thickness at which the core of the tungsten can be generated, on the bottom or side walls of the contact hole by a collimator or CVD process.

The depth of the contact hole varies with the planarization of the insulating layer, so that the surfaces of the contact hole and plug layer are not integrally formed, but the surface of the buried layer is actually formed to be lower than the surface of the contact hole.

As an alternative for aluminum, copper has a lower resistance and possesses good characteristics for resisting eletromigration and stressmigration, which can collectively improve reliability of the metal wire. Studies of forming a metal wire with Cu by sputtering or CVD methods have also been performed.

However, Cu has its own over inherent disadvantages. For example, when a method using a halogen compound (which is useful when etching aluminum), is applied to a metal wire using Cu, the evaporating pressure of the Cu-halogen compound is low, such that its working temperature must be increased to nearly 500° C. to achieve an acceptable etch rate.

There have been two methods which utilize Cu. One method includes forming a trench in the form of a metalization pattern instead of a direct patterning by etching. A Cu layer is deposited on an insulating layer and then a buried conductor line is formed by etching back through CMP (chemical mechanical polishing). Another method using Cu calls for forming a selective plug layer by vertical growth in which a lower conductive layer is used as a seed in a contact hole such as a via hole.

Currently, because the width of the conductive line and the size of the contact hole are reduced with the increasing integration of a semiconductor device, the margin for alignment of the conductive line with the contact hole becomes an increasingly important consideration in order to prevent a decrease in the resistance of the metal wire and its reliability. That is, if the conductive line and contact hole are misaligned, their contact area is reduced, and the current density is increased. Thus, the reliability is declined. Moreover, because the alignment interval is actually decreased, cross-talk occurs. Further, as parasitic capacitance increases, the operational speed of the circuit is reduced. To solve the alignment problem, the technique of self-aligned contacts was developed by NEC Co. in 1992, IEDM., p.305.

FIGS. 1A to 1D illustrate a conventional procedure for manufacturing a metal wire.

The self-aligned contact technique described is a planarized buried metal wire method in which the corners of the contact hole are self-aligned in the trench in parallel to the conductive line so that the contact holes are aligned only in the direction of the width of the conductive line.

As illustrated in FIG. 1A, an etch-stop layer 2 is formed on a planarized insulating layer 1. The two layers are created on a semiconductor substrate (not shown) on which a device is completely formed.

As illustrated in FIG. 1B, the etch-stop layer 2 and insulating layer 1, laid under the etch-stop layer 2, are selectively etched to form trenches 3.

As illustrated in FIG. 1C, a photoresist layer 4 is then deposited and patterned. The insulating layer 1 is selectively removed using the patterned photoresist layer 4 as a mask to form self-aligned contact hole 5. Here, the pattern of one of the trenches 3 and contact hole 5 are formed so as to overlap with each other.

As illustrated in FIG. 1D, a metal layer made of tungsten is buried in the trenches 3 and the contact hole 5. The dashed lines show the configuration of the metal layers as contained in the insulating material 1. The combination is then etched back by CMP to form the plug and buried metal wires 6.

However, a conventional metal wire formed using the described self-aligned contact technique has the following inherent problems.

The primary problem is that the photo-lithography etching process must be performed twice (2) to form the trench and contact hole. Having to repeat this procedure step twice both increases the possibility of nonalignment and increases the costs of manufacturing.

Additionally, while the contact hole is self-aligned in the horizontal direction of the conductive line corresponding to the trench, the contact hole may not self-aligned in the vertical direction. The possibility of misalignment increases as the interval between the metal wires becomes narrow.

SUMMARY OF THE INVENTION

An object of th invention is to solve the above-discussed problems and to provide a metal wire of a semiconductor device and its formation method for improving the resistance characteristics of the wire and its reliability for self-alignment.

The metal wire of a semiconductor device of the invention includes: an insulating layer; a contact plug buried in the insulating layer for coupling to a lower metal wire or impurity diffusion area; a first pattern layer buried in the insulating layer and in contact with the contact plug to be thereby formed; and at least one second pattern layer formed within the first pattern layer in the form of an island.

The invention also is directed to a method for forming a metal wire of a semiconductor device, comprising the steps of forming an insulating layer and first etch-stop layer on a substrate forming a first trench having sidewalls and a bottom by selectively removing portions of said first etch-stop layer forming a second etch-stop layer on the insulating layer, including the first trench, and first-etch stop layer etching back said second etch-stop layer from with in the trench to form a mask from said first and second etch-layers exposing a portion of the trench bottom, wherein the width of the mask has a width of less than the width of the trench bottom etching the insulating layer using said first and second etch-stop layers mask to form a second trench extending through the insulating layer for holding a contact plug removing said first and second etch-stop layers and forming a contact plug and conductive layer in said first and second trenches.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and thus are not limitative of the present invention, and wherein:

FIGS. 4A to 4F are cross-sectional views of the metal wire of the invention along lines A–A', B–B', C–C' and D–D'.

DETAILED DESCRIPTION OF PREFERRED EMBODIMENT

With reference to the attached drawings, a metal wire of a semiconductor device and a method for forming the metal were will be described as follows.

In a preferred embodiment of the invention, a contact hole is made to be self-aligned in two respects. First, the contact hole is aligned in the direction of the conductive line's length. Additionally, it is aligned in a vertical direction to insure that the connection area between the conductive line and a contact plug is properly aligned when forming the metal wire.

Figure 1A:
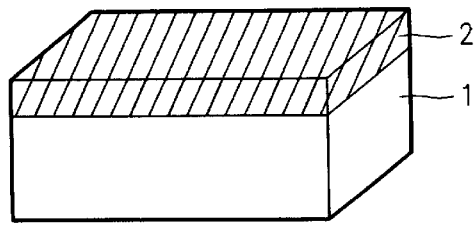
FIGS. 1A to 1D are cross sectional views illustrating conventional metal wire procedures.
Figure 1B:
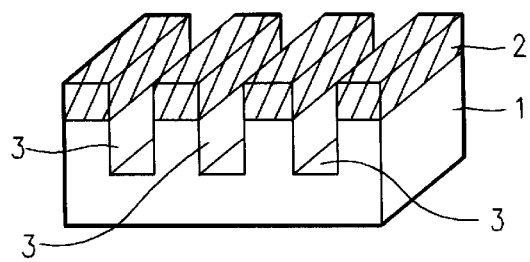
Figure 1C:
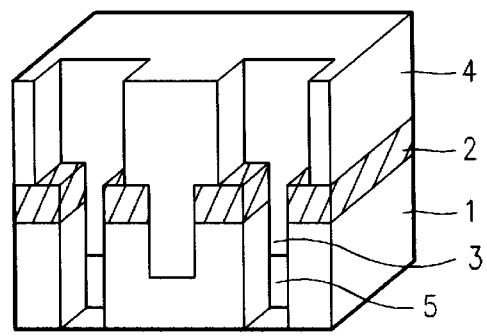
Figure 1D:
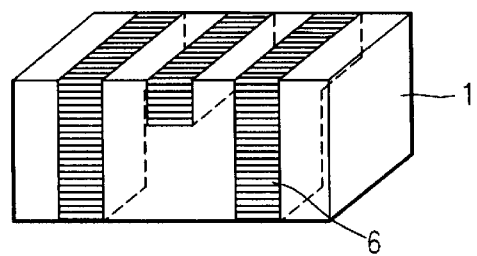
Figure 2A:
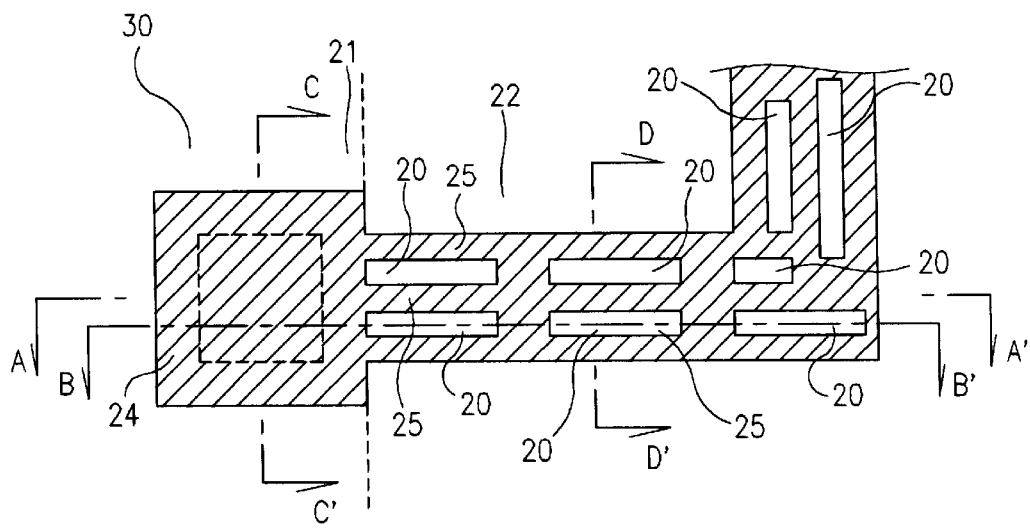
FIG. 2A is a layout of a metal wire of the invention.
Figure 2B:
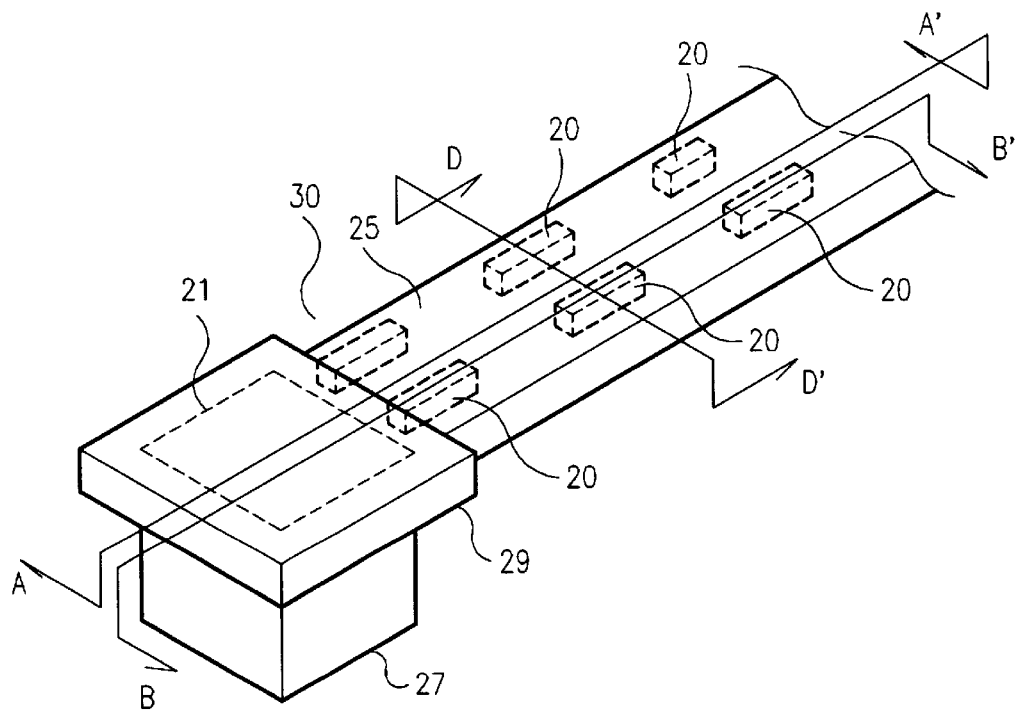
FIG. 2B is a perspective view of the metal wire as shown in FIG. 2A.

With reference o FIGS. 2A and 2B, the metal wire 30 is divided into a window area 21 and a conductive line area 22.

The conductive line area 22 includes a conductive line pattern 25 with regions of insulating material 20.

The window area 21 of the metal wire 30 is an extension of the conductive line area 22. The physical dimensions of the upper portion 35 of the windows section 21 a compared to the conductive line area 22 and the plug 24 (discussed below) is an important aspect of the disclosed metal wire 30 which facilitates two-way self alignment. While the height of the upper portion of the window area 21 is the same as the height of the adjoining conductive area 22, the upper portion 35 of the window area 21 has a width which is comparatively greater than the width of the adjoining conductive area 22.

Figure 3A:
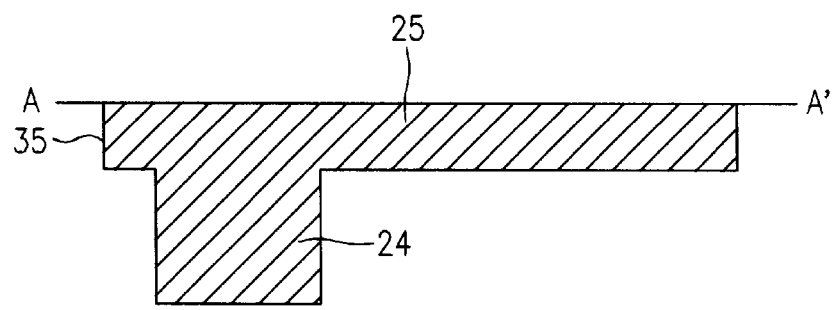
FIGS. 3A and 3B are cross-sectional views of FIGS. 2A and 2B taken along lines A–A', B–B', C–C' and D–D'.
Figure 3B:
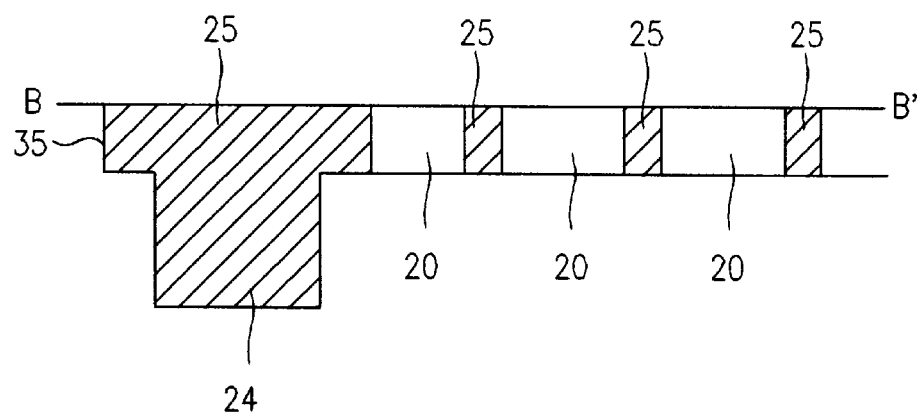

The lower portion of the window area 21 defines the contact plug 24 The contact plug 24 extends downward and is buried within the insulating material 20. As seen in FIGS. 2A, 3A and 3B, the width and depth of the upper portion 35 adjoining the contact plug 24 is comparatively greater. This accomplishes self-alignment of the plug 24 with the upper portion 35 in a second respect.

The process for forming a metal wire of the semiconductor device described hereinbefore will be described with reference to FIGS. 4A–4F.

The metal wire manufacturing process can be generally divided into two steps. The first step is to form first and second trenches 27 and 29. The second step is to form the conductive line pattern layers along the window area 21 and the conductive area 22.

The metal wire includes a first trench 27 formed on the overall surface of an insulating layer 20 in a predetermined size after a source/drain area is formed or a lower side metal wire is completed, and a second trench 29 formed on part where the first trench 27 is formed to be larger than the first trench 27. A contact plug 24 which is in contact with the lower side metal wire or a impurity diffusion area is formed on the second trench 29, and a first conductive line pattern layer 2 having a larger area than the contact plug 24 is formed on the upper first trench 27. The conductive area 22 is connected to the first conductive line pattern layer 23, and a second conductive line pattern layer 25 having at least one island-type isolated area is formed in the first conductive line pattern layer 23.

In each of FIGS. 4A–4F, the method of forming the metal wire is described by referring to four separate views along lines A–A', B'B', C–C', and D–D'. These cross-sectional views illustrate the respective views of the various layers and elements used in the manufacturing process.

As illustrated in FIG. 4A, the insulating layer 20 is formed on the substrate where the lower side metal wire or impurity diffusion area is formed, and a first etch-stop layer 26 is formed thereon. The insulating layer 20 is an oxide film or an impurity doped oxide film such as an organic insulating layer, for example, BPSG or polyamide. The first etch-stop layer 26 is formed using one of an oxide layer, and nitride film which has an etch selectivity with the insulating layer 20. The first etch-stop layer 26 and insulating layer 20 re selectively etched using a photoresist pattern as a mask to form the first trench 27 on the window are a 21 and conductive area 22.

As illustrated in FIG. 4B, the secondary insulating material 28 having an etch selectivity distinct from the insulating layer 20 is deposited on the overall surface of the trench 27 and etch stop layer 26. The insulating material 28 is formed to be as thick as the margin width W of the window area 21 in order to define an outline for the second trench 29 that will later form the contact plug 24. Here, the secondary insulating material 28 substantially buries the first trench 27 of the conductive area 22.

As illustrated in FIG. 4C, the insulating material 28 is then etched-back to form a second etch-stop layer 28. Here, the secondary insulating material 28 remains in the form of a sidewall around the first trench 27 of the window area 21.

Figure 4D:
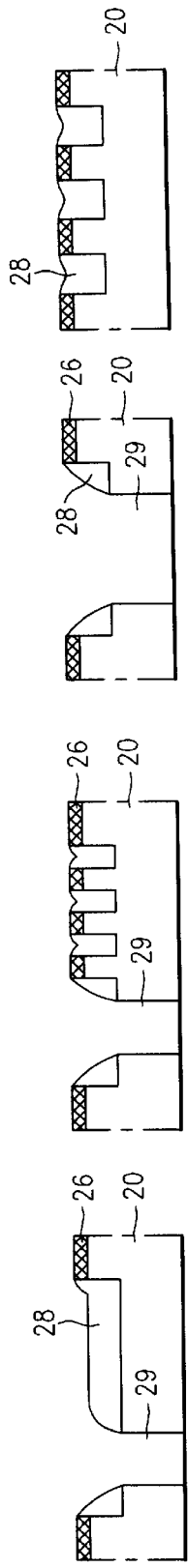

In FIG. 4D, the insulating layer 20 is selectively etched using the first and second etch-stop stop layers 26 and 28 as masks to form a second trench 29 having a width narrower than the first trench 27 and within the firs trench 27 of the window area 21.

Figure 4E:
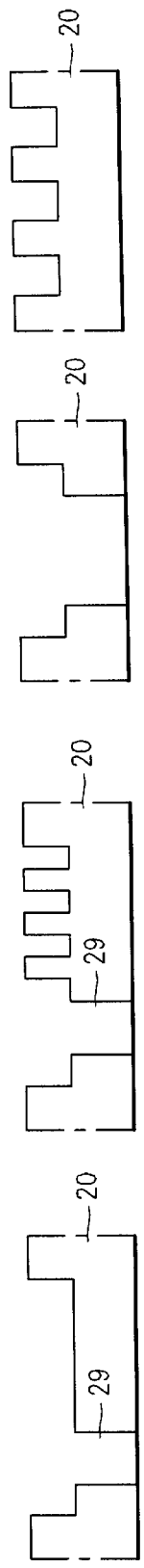
Figure 4F:
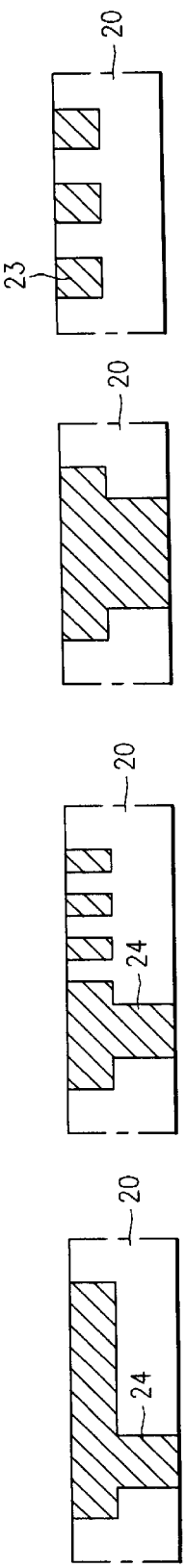

In FIGS. 4E an 4F, the first and second etch-stop layers 26 and 28 are then removed. A conductive material layer such as Al, Ag, or Cu, (or a metal alloy layer made up of metal alloy components), or their depositing layer is deposited on the overall surface of the firs and second trenches 27 and 29. The deposited metal layer is etched back by a dry-etching or CMP process to a level equal with that of the insulating laye 20. Both the plug 24 and the conductive line 25 may be formed of the same material.

When patterning the conductive line by the CMP process, a slurry is used as a polishing agent, which includes polishing particles such as silica or alumina, acid such a $H_3PO_4$, $H_2SO_4$, and $AgNO_3$, and oxidizing agent such as $H_2O_2$ or HOCl.

In one embodiment, conductive material layer for forming the metal wire is deposited by a physical depositing method such as sputtering or LPCVD.

The metal wire of the semiconductor device of the invention has the characteristics as follows.

First, all the corners of the contact hole are self-aligned in the metal wire, so that its resistance and reliability are improved as the contact area is secured.

Second, two patterns of the contact hole made up with the first and second trenches and the metal wire can be formed by only one photo-etching process, thereby simplifying the whole process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A method for forming a metal wire of a semiconductor device, comprising the steps of:
    forming an insulating layer and a first etch-stop layer on a substrate;
    forming a first trench having sidewalls and a bottom by selectively removing portions of said first etch-stop layer;
    forming a second etch-stop layer on the insulating layer, including the first trench, and on the first-etch stop layer;
    etching back said second etch-stop layer from within the first trench to form a mask from said first and second etch-stop layers exposing a portion of the bottom of the first trench, wherein the width of the mask has a width less than the width of the bottom of the first trench;
    etching the insulating layer using said first and second etch-stop layers as a mask to form a second trench extending through the insulating layer;
    removing said first and second etch-stop layers; and
    forming a contact plug and a conductive layer in said first and second trenches.

2. The method as claimed in claim 1, wherein said step of forming a first trench includes forming the first trench with a conductive line portion and a plug portion.

3. The method as claimed in claim 2, further comprising:
    forming a plurality of auxiliary pattern layers in the conductive line portion of the first trench.

4. The method as claimed in claim 1, wherein said first etch-stop layer is formed of a material having an etch selectivity with respect to said insulating layer.

5. The method as claimed in claim 1, wherein said second etch-stop layer is formed of a material having an etch selectivity with said insulating layer.

6. The method as claimed in claim 2, wherein said step of etching back said second etch-stop layer includes etching only the plug portion, so that said insulating layer in the conductive line portion is not etched during the etching process of the insulating layer for forming said second trench.

7. The method as claimed in claim 2, further comprising:
    forming at least one auxiliary pattern layer in the conductive line portion of the first trench.

8. The method as claimed in claim 3, wherein the interval between auxiliary pattern layers is equal to or less than the difference in width between the first and second trenches.

9. The method as claimed in claim 7, wherein said auxiliary pattern layer is formed by etching said insulating layer.

10. The method as claimed in claim 1, wherein said conductive layer is formed of a metal.

11. The method as claimed in claim 2, wherein in said step of forming a first trench, only the plug portion is etched back to form the second trench and the conductive line portion is not etched-back.

12. The method as claimed in claim 1, wherein said step of forming the said conductive layer contact plug includes forming the conductive layer and contact plug to a height equal to or greater than the height of the insulating layer.

13. The method as claimed in claim 12, wherein said step of forming the conductive layer and contact plug includes planarizing said conductive and insulating layers by dry etching using chemical-mechanical polishing (CMP) process.

14. The method as claimed in claim 13, wherein the polishing agent used in the CMP process is a polishing particle slurry including silica, alumina, acid, and an oxidizing agent.

15. The method as claimed in claim 14, wherein the acid includes one of $H_3PO_4$, $H_2SO_4$, and $AgNO_3$.

16. The method as claimed in claim 14, wherein the oxidizing agent for the CMP process includes one of $H_2O_2$ and HOCL.

17. The method as claimed in claim 1, wherein said first etch-stop layer is one of an oxide layer, a nitride film and a polymer.

18. The method as claimed in claim 1, wherein said first etch-step layer is formed of an oxide.

19. The method as claimed in claim 10, wherein said metal is one of Al, Ag, Cu and their alloys.

20. The method as claimed in claim 12, wherein said step of forming the conductive layer and plug includes planarizing said conductive and insulating layers by dry etching using chemical-mechanical polishing (CMP) process.

* * * * *